(12) United States Patent
Liu

(10) Patent No.: US 7,330,137 B2
(45) Date of Patent: Feb. 12, 2008

(54) METHOD AND APPARATUS FOR RLL CODE ENCODING AND DECODING

(75) Inventor: Pi-Hai Liu, Taipei (TW)

(73) Assignee: MediaTek Inc., Hsin-Chu (TW)

( * ) Notice: Subject to any disclaimer, the term of this patent is extended or adjusted under 35 U.S.C. 154(b) by 852 days.

(21) Appl. No.: 10/707,419

(22) Filed: Dec. 12, 2003

(65) Prior Publication Data

US 2005/0129133 A1    Jun. 16, 2005

(51) Int. Cl.
*H03M 5/00* (2006.01)
(52) U.S. Cl. .............................. 341/58; 341/50; 341/51; 341/57; 341/59
(58) Field of Classification Search ................... 341/58, 341/57, 59, 63, 67, 50, 51
See application file for complete search history.

(56) References Cited

U.S. PATENT DOCUMENTS 5,751,232 A * 5/1998 Inoue et al. ................... 341/63
6,388,588 B2 * 5/2002 Kitamura ...................... 341/67
6,496,541 B1  12/2002 Kahlman
6,765,511 B2 * 7/2004 Hayami ........................ 341/59
2005/0053160 A1  3/2005 Immink

FOREIGN PATENT DOCUMENTS

CN    1383616 A    12/2002

\* cited by examiner

*Primary Examiner*—Jean B Jeanglaude
(74) *Attorney, Agent, or Firm*—Winston Hsu

(57) ABSTRACT

An encoder and decoder for encoding data bits of a binary source signal into a stream of data bits of a binary channel signal and vice versa includes a conversion table used to map m-bit source words to codeword having a variable code length with a basic code length of n bits and a total code length of n*i bits, i being an integer of at least 1. The conversion table preserves the parity of the m-bit source words over the codeword and limits a characteristic of the codeword specified for each starting bit position in the code word.

42 Claims, 8 Drawing Sheets

|  | Data | Codeword |
|---|---|---|
| Substitutions for i = 2 | 00.11<br>00.10<br>00.01<br>00.00 | 000.00x<br>000.010<br>100.00x<br>100.010 |
| Basic Substituions | 11<br>10<br>01 | 00x<br>010<br>10x |

| Previous Codeword Encoder only ($C_{-2} C_{-1} C_{-0}$) | Source Words ($D_1$ to $D_{10}$) | Codewords ($C_1$ to $C_{15}$) |
|---|---|---|
| Substitutions for $RMTR_{VAR}=(4,5,4)$  $k_{VAR}=(6,7,6)$ | | |
|  | 11.00.01.11.00 | 100.001.010.010.010 |
|  | 11.00.01.11.01 | 101.001.010.010.010 |
|  | 11.00.01.11.10 | 100.100.000.010.010 |
|  | 11.00.01.11.11 | 100.100.010.010.010 |
|  | 01.00.01.11.00 | 001.000.001.010.010 |
|  | 01.00.01.11.01 | 001.010.010.010.010 |
|  | 01.00.01.11.10 | 001.001.010.010.010 |
| XX0 | 01.00.01.11.11 | 100.101.010.010.010 |
| XX1 | 01.00.01.11.11 | 000.010.010.010.010 |

Fig. 7

| Substitutions for RMTR=5 | | |
|---|---|---|
| | Source Words (D$_1$ to D$_{10}$) | Codewords (C$_1$ to C$_{15}$) |
| | 11.10.10.00.01 | 100.010.010.010.010 |
| Substitutions for RMTR=6 | | |
| Previous Codeword Encoder only (C$_{-2}$ C$_{-1}$ C$_0$) | Source Words (D$_1$ to D$_8$) | Codewords (C$_1$ to C$_{12}$) |
| 000 | 11.10.11.10 | 100.001.010.010 |
| 000 | 01.10.11.10 | 101.010.010.010 |
| Not 000 | 01.10.11.10 | 000.010.010.010 |
| Substitutions for K=7 | | |
| 010 | 00.01.11.00 | 100.000.010.010 |
| 010 | 00.01.11.01 | 100.010.010.010 |
| 010 | 00.01.11.10 | 001.010.010.010 |
| 010 | 00.01.11.11 | 000.001.010.010 |
| Substitutions for K=8 | | |
| | Source Words (D$_1$ to D$_6$) | Codewords (C$_1$ to C$_9$) |
| | 00.00.00 | 000.010.010 |
| | 00.00.01 | 001.010.010 |
| | 10.00.00 | 100.010.010 |
| | 10.00.01 | 101.010.010 |
| Substitutions for d=1 | | |
| | Source Words (D$_1$ to D$_4$) | Codewords (C$_1$ to C$_6$) |
| | 01.10 | 001.010 |
| | 01.11 | 000.010 |
| | 11.10 | 101.010 |
| | 11.11 | 100.010 |
| Basic Substitutions | | |
| | Source Words (D$_1$ to D$_2$) | Codewords (C$_1$ to C$_3$) |
| | 00 | 000 |
| | 01 | 001 |
| | 10 | 100 |
| | 11 | 101 |

Fig. 8

METHOD AND APPARATUS FOR RLL CODE ENCODING AND DECODING

BACKGROUND OF INVENTION

1. Field of the Invention

The invention relates to an encoding device and a decoding device, and more particularly, to an encoding device and a decoding device for use in a high-density recording system or a high-density data transmission system.

2. Description of the Prior Art

When data is transmitted through a transmission line or recorded onto a recording medium such as a magnetic disc, an optical disc, or a magneto-optic disc, the data is first encoded into a code appropriate for the transmission line or the recording medium. As Kahlman, et al. describe in U.S. Pat. No. 4,477,222 and U.S. Pat. No. 6,496,541, a well known encoding technique is variant of block encoding expressed as Run Length Limited (RLL) (d, k; m, n; r). In RLL (d, k; m, n; r), m-bit source words are blocked into units each comprising m*i bits. Each unit is converted into a code word having a total code length of n*i bits, and as RLL is a variable length code, i is an integer of at least 1 ranging to a maximum value of r.

Because of the non-zero switching times of bit transitions, to prevent ambiguity at the receiver between successively received "1"s that could cause a "0" between the "1"s to be misinterpreted as a "1", the parameter d is used to specify the minimum number of "0"s that must appear between two consecutive "1"s. d is referred to as a minimum run of zeros. Additionally, to prevent long runs of "0"s, which would prevent the receiver from doing timing recovery, the parameter k is used to specify the maximum number of "0"s appearing between two consecutive "1"s. k is referred to as a maximum run of zeros.

Many transmission lines and recording media are not suitable for transmitting or storing an absolute value such as a "0" or a "1" but are well adapted for bit transitions, in other words the act of switching from a "0" to a "1" or vice versa. To accommodate this restriction, the variable length code undergoes an NRZI (Non Return to Zero Inverted) conversion where each "1" of the variable length code is interpreted as a bit inversion while each "0" of the variable length code is interpreted as a non-inversion. The NRZI modulated variable length code is referred to as a recording wave train.

Let notations Tmin and Tmax denote the minimum and maximum inversion periods of a recording wave train respectively. In order to record the recording wave train at a high recording density, a long minimum inversion period Tmin is preferred, equating to a large minimum run of zeros d. Additionally, from the clock recovery point of view, it is desirable to have a short maximum inversion period Tmax, equating to a small maximum run of zeros k. In order to satisfy these requirements, a variety of encoding techniques have been developed.

FIG. 1 shows a typical conversion table 10 for the variable length RLL (1,7) code. A common encoding technique for optical discs, magnetic discs, or magneto-optic discs is the variable length code RLL (1,7), which can also be expressed as (1, 7; 2, 3; 2). Please note, in FIG. 1, the lower case "x" used in the conversion table 10 has the value "1" if the next successive channel bit is a "0" or has the value "0" if the next successive channel bit is a "1".

The minimum inversion period Tmin, which can be expressed as (d+1)T, for FIG. 1 is thus equal to 2T, where T is a bit gap in the recording wave train. The fact that a lot of bit edges are generated at short intervals is helpful for the generation of a clock signal in the receiver. However, as the recording line density is further increased, this minimum run of zeros d adversely affects overall performance. For example, if minimum inversion periods 2T are generated consecutively, the closely spaced waveform in the recording wave train is especially prone to distortion generated by disturbances such as noise. Furthermore, because the dominate error event encountered while reading back data stored in a high density recording system is a 2T interval being misread as a 1T interval, a single error can effectively cause a shift of the front edge of a block of received codewords resulting in a run of bit errors for the entire repeated consecutive minimum runs of zeros d.

In U.S. Pat. No. 6,496,541, Kahlman et al. describe an RLL(1,7) encoder/decoder that limits the repeated minimum transition runs to a value of six, also expressed as RMTR=6. The RMTR constraint limits the number of consecutive appearances of minimum runs d to a maximum value of six.

FIG. 2 shows a finite state transition diagram 20 for the bit stream of an RLL(1,7) RMTR=6 constrained system according to the prior art. All compliant bit transitions are indicated on this diagram. As an example of a noncompliant bit stream, suppose the current state is at node A. Node A indicates the immediately preceding bits received were "... 10101010101010" as the only way to reach node A is to pass through this sequence of bits. Node A has only a single path going to node B when a "0" is received. This is because a "0" must be received. If an additional "1" were received, this would mean that the immediately preceding bits were "... 101010101010101", which violates the RMTR=6 constraint. Similarly, due to the maximum run of zeros being specified as k=7, node C has only a single path going to node D when a "1" is received. If an additional "0" were received at node C, this would mean that eight zeros were been received in a row, violating the k=7 constraint.

Although an RMTR constrained system such as that shown in FIG. 2 reduces the resulting run of bit errors for a consecutive run of minimum runs d caused by a 2T interval being misread as a 1T interval, the bit errors that do occur are often uncorrectable. For example if a "1" is received at node A, although the system can detect this as an error, the correct bit stream is not obvious.

An additional problem with the typical RLL(1,7) encoder/decoders according to the prior art is a maximum run k being misinterpreted as a SYNC signal. Generally speaking, data systems employ consecutive long run length patterns as the SYNC pattern. For example, a typical SYNC pattern is defined as consecutive 9T internals. In an RLL(1,7) based system, the maximum inversion internal is 8T. A timing error (or another error) could occur causing the receiver to misread an 8T interval as a 9T interval. If consecutive errors of this nature occur, a SYNC pattern could be mistakenly received.

SUMMARY OF INVENTION

It is therefore a primary objective of the claimed invention to provide an encoder and decoder that limits a characteristic of the codeword for each starting bit position in the codeword, to allow correction of errors caused by 2T intervals being misread as 1T internals and to help prevent mistakenly received SYNC patterns.

According to the claimed invention, a device for encoding a bit stream of data bits of a binary source signal into a stream of data bits of a binary channel signal, the bit stream of the binary source signal being divided into m-bit source words. The device comprises converting means used to convert m-bit source words into codeword having a variable code length with a basic code length of n bits and a total code length of n*i bits, i being an integer of at least 1. The converting means limits a characteristic of the codeword specified for each starting bit position in the code word.

According to the claimed invention, a device for decoding a bit stream of data bits of a binary channel signal into a stream of data bits of a binary source signal, the bit stream of the binary source signal being divided into m-bit source words. The device comprises converting means used to convert codeword having a variable code length with a basic code length of n bits and a total code length of n*i bits into m-bit source words, i being an integer of at least 1. The converting means limits a characteristic of the codeword specified for each starting bit position in the code word.

These and other objectives of the claimed invention will no doubt become obvious to those of ordinary skill in the art after reading the following detailed description of the preferred embodiment that is illustrated in the various figures and drawings.

BRIEF DESCRIPTION OF DRAWINGS

FIG. 7 is a second time-variable conversion table for use by the encoder of FIG. 3 and the decoder of FIG. 4 according to the second embodiment of the present invention.

FIG. 8 is a main conversion table for use by the encoder of FIG. 3 and the decoder of FIG. 4 according to the present invention.

DETAILED DESCRIPTION

Figure 1:
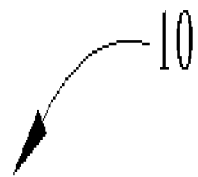
FIG. 1 is a conversion table for RLL(1,7; 2, 3; 2) according to the prior art.
Figure 2:
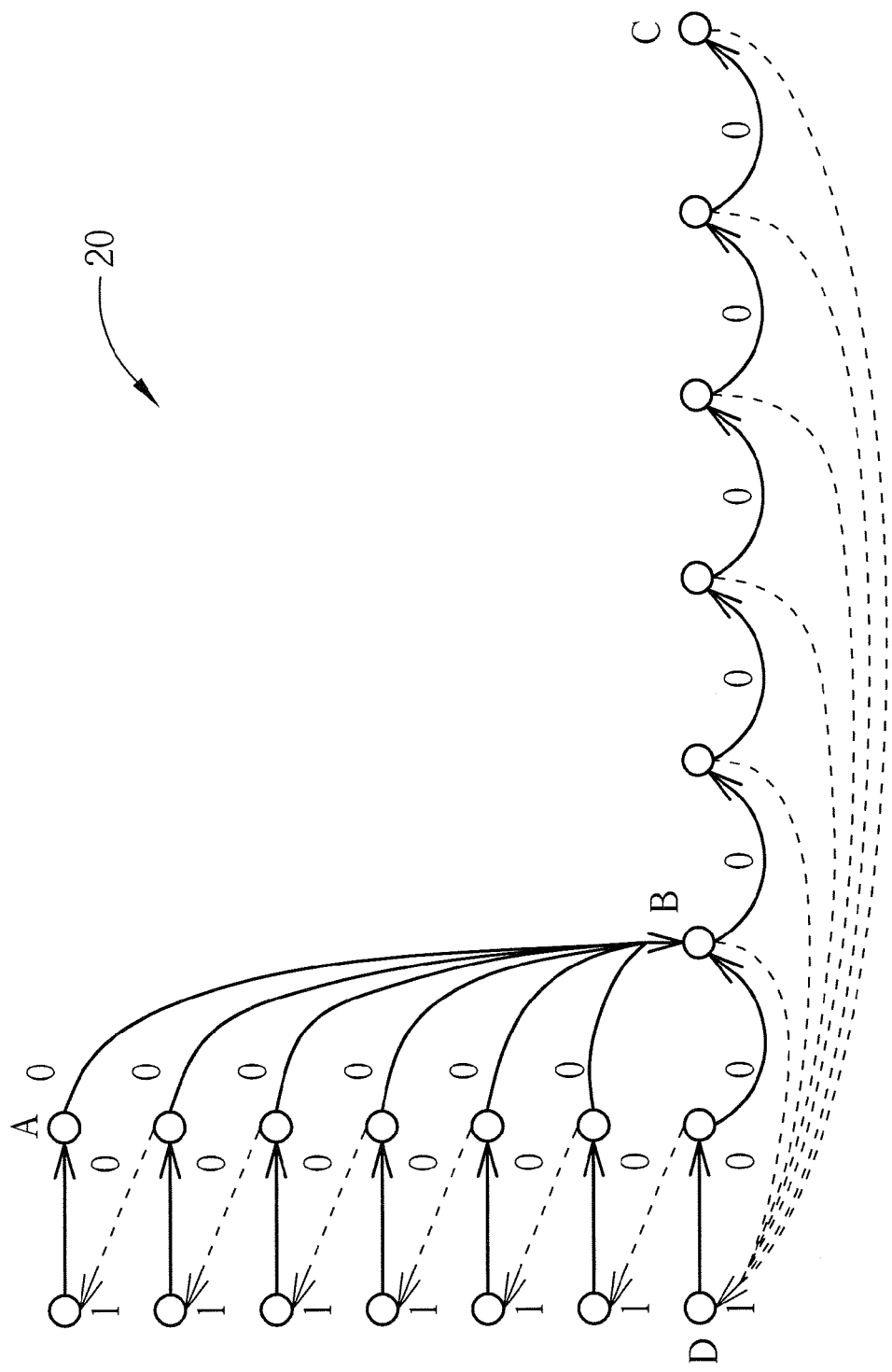
FIG. 2 is a finite state transition diagram for an RLL(1,7) RMTR=6 constrained system according to the prior art.
Figure 3:
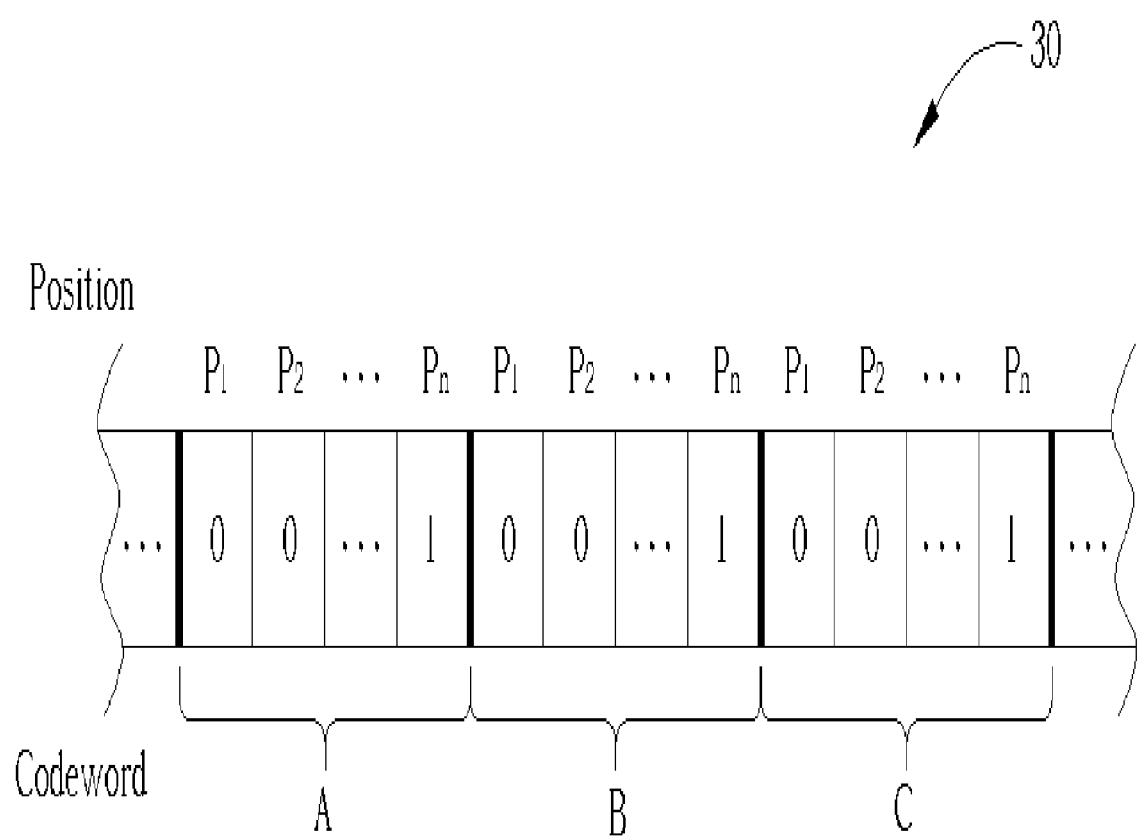
FIG. 3 is a diagram of the bit positions assigned to the bits in each codeword according to the present invention.

FIG. 3 shows an example bit stream 30 of a channel signal divided into codeword A, B, C. According to the present invention, each code word is divided into bit positions, labeled $P_1P_2P_3 \ldots P_n$. P1 is the first bit position of the codeword, P2 the second, and so on with Pn being the last bit position. By limiting a characteristic of the codeword specified for each starting bit position, error correction is possible and SYNC pattern detection is more accurate. Because the bit positions represent the bit times, limiting a characteristic of the codeword is also referred to as making a parameter time-variable.

The following example shows how a time-variable repeated minimum transition run RMTR can be used to assist error correction using an RLL(1,7) based codeword.

123123123123123123<--codeword bit positions
101010011001010100<--received code
2 2313 2 2 3<--transitions T The received code shown above contains a 1T transition which is illegal in a RLL(1,7) system. Assuming a timing error caused a single bit transition to be received at the wrong time, there are 2 possible ways to correct the received code.

The first correction is to move the leading-edge of the 1T transition to one bit earlier than the received code, shown below as possible code #1.

123123123123123123<--codeword bit positions
101010101001010100<--possible code #1
2 222 3 223<--transitions T The second correction is to move the trailing edge of the 1T transition to one bit later than the received code, shown below as possible code #2.

123123123123123123<-- codeword bit positions
101010010101010100<-- possible code #2
2 2322 223<-- transitions T In an RMTR=4 constrained system, both possible code #1 and possible code #2 could be correct codewords. By limiting the repeated minimum transition runs RMTR to 3 for the first bit position, 4 for the second bit position, and 3 for the third bit position, expressed as $RMTR_{VAR}=(3, 4, 3)$, only possible code #2 is compliant. Possible code #1 is not a correct codeword because possible code #1 has 4 consecutive minimum transition runs 2T starting at bit position 1. Possible code #2 is a compliant codeword because possible code #2 has a 4 consecutive minimum transition runs 2T starting at bit position 2.

Making the maximum run of zeros k constraint time-variable allows better rejection of mistakenly received SYNC patterns. For example, by limiting the maximum run of zeros k to 6 for the first bit position, 7 for the second bit position, and 6 for the third position, expressed as $k_{VAR}=(6, 7, 6)$; a consecutive run of 7 zeros (ie. an interval of 8T) can only occur if it starts from the second bit position. Because a typical SYNC pattern is defined as consecutive 9T internals, consecutive timing errors could cause an 8T interval to be misread as a SYNC pattern. In a $k_{VAR}=(6, 7, 6)$ limited system this can only happen when starting from the second bit position as the encoder will send a maximum of only 6 zeros when starting from the first and third bit positions. In a $k_{VAR}$ constrained system, the difference between the data portion of the codeword and the SYNC pattern is more significant than in a system with only a k constraint.

Figure 4:
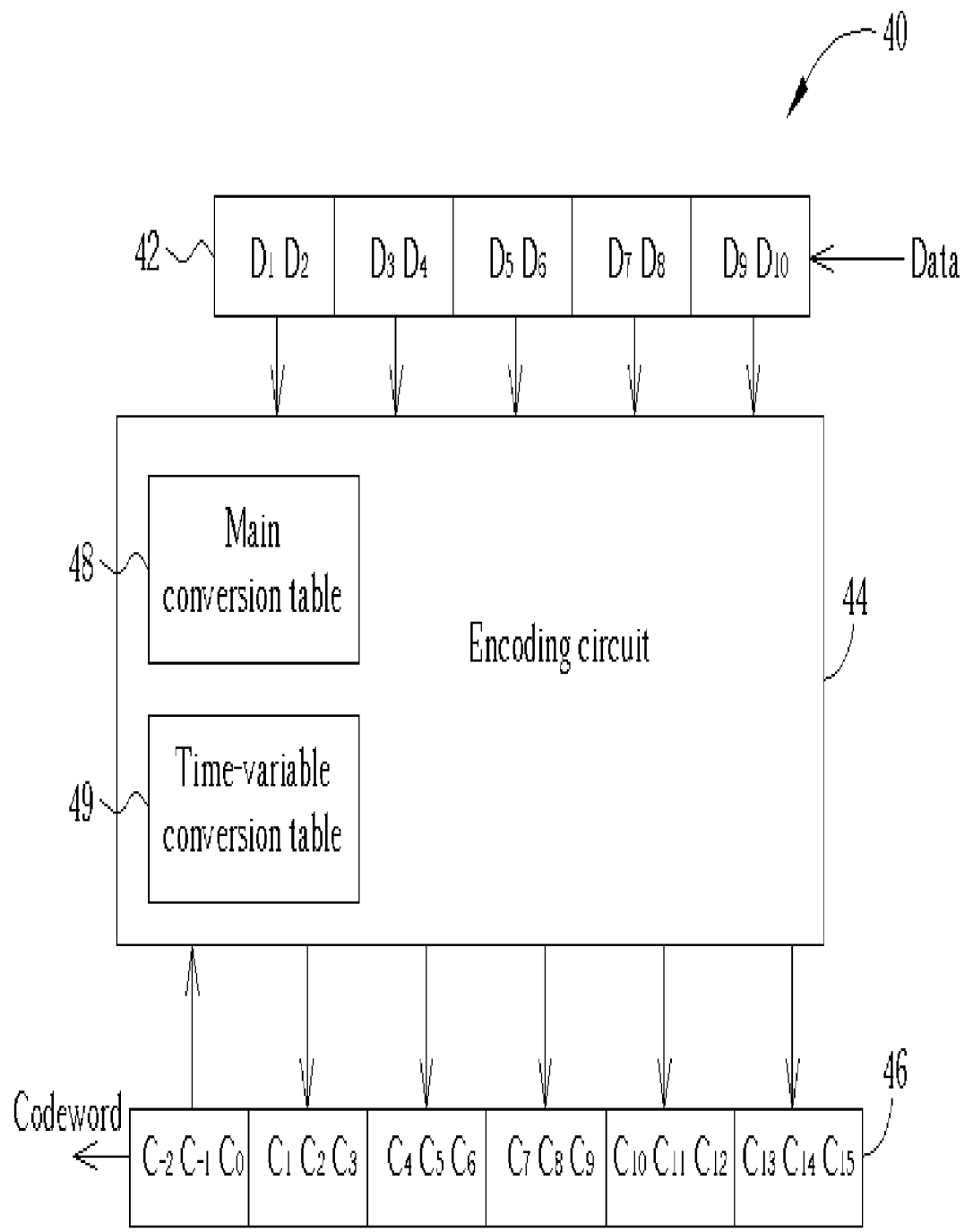
FIG. 4 is a block diagram of an encoder according to present invention.

FIG. 4 shows a block diagram of an encoder 40 according to present invention. The encoder 40 comprises an incoming data shift-register 42 connected to an encoding circuit 44, which is connected to an outgoing codeword shift-register 46. Additionally, the encoding circuit 44 includes a main conversion table 48 and a time-variable conversion table 49.

The encoder 40 converts 2-bit source words to 3-bit codeword and has a maximum code length of r=5. Serial data bits for a binary source signal are shifted into the incoming data shift-register 42. In FIG. 4, $D_1D_2$ represents the first 2-bit source word, $D_3D_4$ represents the second 2-bit source word, and so on with $D_9D_{10}$ representing the fifth 2-bit source word. The encoding circuit 44 checks the time variable conversion table 49 and the last code word sent $C_{-2}C_{-1}C_0$ for a substitution rule to convert the 5 source words to 5 codeword. If a rule exists, the encoding circuit 44 loads the outgoing codeword shift-register ($C_1$ to $C_{15}$) with the corresponding 5 codeword. The 5 codeword are shifted out and 5 new source words are shifted into the incoming data shift-register 42.

If no substitution rule exists for all 5 source words grouped together, the encoding circuit 44 checks the main conversion table 48 for a substitution rule to convert the first 4 source words ($D_1$ to $D_8$) to 4 codeword depending on the last code word sent $C_{-2}C_{-1}C_0$. If a rule exists, the encoding circuit 44 loads the first 4 codeword ($C_1$ to $C_{12}$) in the outgoing codeword shift-register 46 with the corresponding 4 codeword. The 4 codeword ($C_1$ to $C_{12}$) are shifted out and 4 new data words are shifted into the incoming data shift-register 42.

Similarly, if no substitution rule exists for the first 4 source words grouped together, the encoding circuit 44 checks the main conversion table 48 for a substitution rule to convert the first 3 source words ($D_1$ to $D_6$). Again, if no substitution rule exists, the encoding circuit 44 checks for a rule for the first 2 source words ($D_1$ to $D_4$) and finally, if no rule exists, the encoding circuit uses the main conversion table 48 to convert the first source word $D_1D_2$ to the first codeword $C_1C_2 C_3$. The number of source words for which a match is found is the same number of codeword that are shifted out of the outgoing codeword register 46 and the same number of source words that are shifted into the incoming data shift-register 42.

Figure 5:
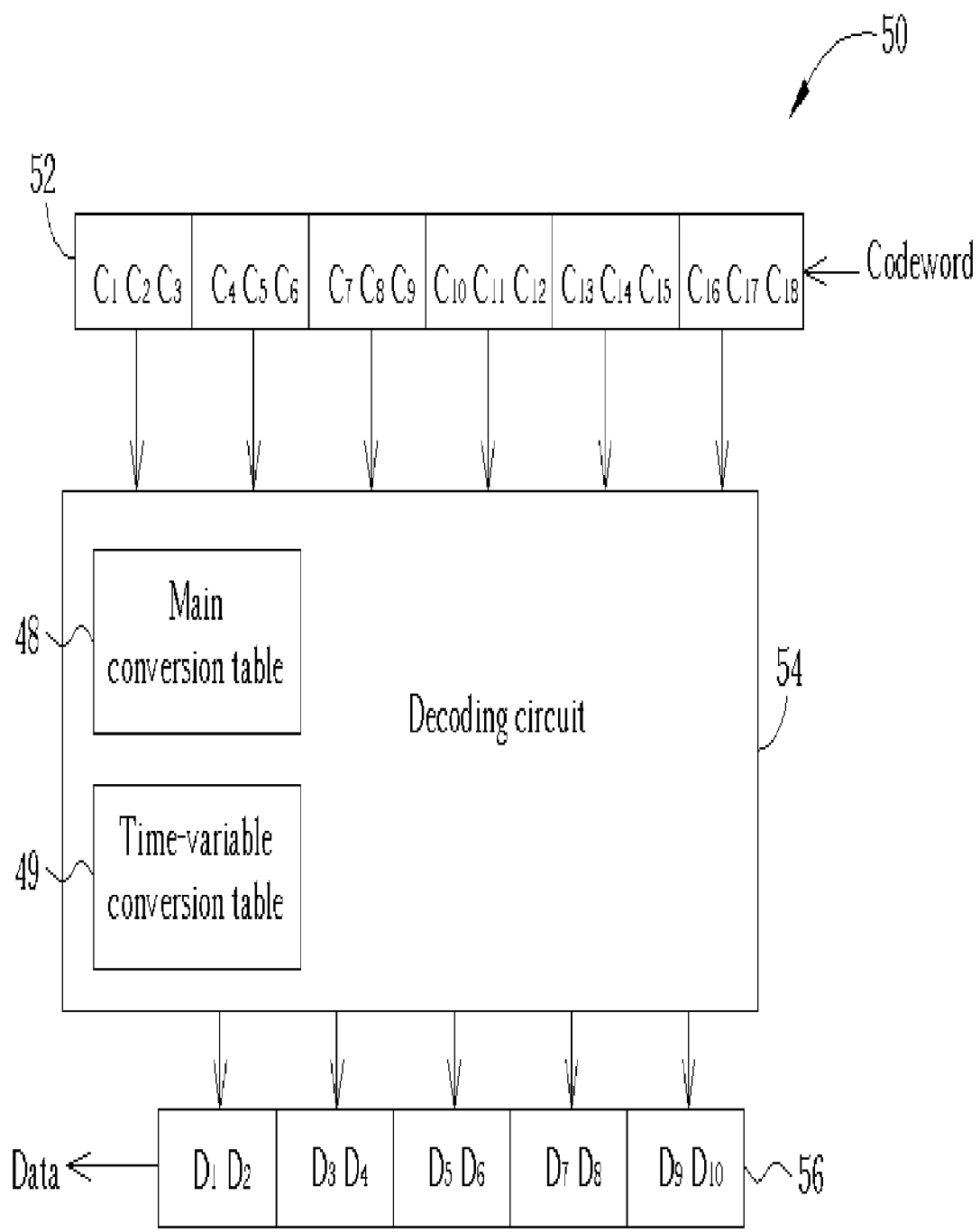
FIG. 5 is a block diagram of a decoder according to present invention.

FIG. 5 shows a block diagram of a decoder 50 according to the present invention. The decoder 50 comprises an incoming codeword shift-register 52 connected to a decoding circuit 54, which is connected to an outgoing data shift-register 56. As in FIG. 4, the decoding circuit also includes the main conversion table 48 and the time variable conversion table 49.

The decoder 50 performs the opposite operation to that of the encoder 40 described in FIG. 4. The decoder 50 converts 3-bit codeword to 2-bit data words having a maximum code length of r=5. Serial codeword bits for a binary codeword signal are shifted into the incoming codeword shift-register 52, which holds a total of 6 codeword. In FIG. 5, $C_1C_2C_3$ represent the first 3-bit source word, $C_4C_5C_6$ represent the second 3-bit codeword, and so on with $C_{13}C_{14}C_{15}$ representing the fifth 3-bit codeword. Because the decoder circuit 54 also needs to check the next incoming code word, the sixth codeword, $C_{16}C_{17}C_{18}$, is also included in the incoming codeword shift-register 52. The decoding circuit 54 checks the time variable conversion table 49 depending on the next incoming code word $C_{16}C_{17}C_{18}$ for a substitution rule to convert the 5 codeword ($C_1$ to $C_{15}$) into 5 source words ($D_1$ to $D_{10}$). If a rule exists and the next incoming code word $C_{16}C_{17}C_{18}$ is not equal to (010), the decoding circuit 54 loads the outgoing data shift-register 56 with the corresponding 5 data words. The 5 data words ($D_1$ to $D_{10}$) are shifted out and 5 new codeword are shifted into the incoming codeword shift-register 52. If a rule exists but the next incoming code word $C_{16}C_{17}C_{18}$ is equal to (010), then the decoding circuit 54 checks the main conversion table 48 to convert the first codeword $C_1C_2C_3$ to the first data word $D_1 D_2$. The decoding circuit 54 loads the outgoing data shift-register 56 with the corresponding 1 data word. The 1 data word ($D_1D_2$) is shifted out and 1 new codeword is shifted into the incoming codeword shift-register 52.

If no substitution rule exists for all 5 codeword grouped together, the decoding circuit 54 checks the main conversion table 48 for a substitution rule to convert the first 4 codeword ($C_1$ to $C_{12}$) to 4 data words depending on the next code word $C_{13}C_{14}C_{15}$. If a rule exists and the next incoming code word $C_{13}C_{14}C_{15}$ is not equal to (010), the decoding circuit 54 loads the first 4 data words in the outgoing data word shift-register 56 with the corresponding 4 data words. The 4 data words ($D_1$ to $D_8$) are shifted out and 4 new codeword are shifted into the incoming codeword shift-register 52. If a rule exists but the next incoming code word $C_{13}C_{14}C_{15}$ is equal to (010), then the decoding circuit 54 checks the main conversion table 48 to convert the first codeword $C_1C_2C_3$ to the first data word $D_1D_2$. The decoding circuit 54 loads the outgoing data shift-register 56 with the corresponding 1 data word. The 1 data word ($D_1D_2$) is shifted out and 1 new codeword is shifted into the incoming codeword shift-register 52.

Similarly, if no substitution rule exists for the first 4 codeword ($C_1$ to $C_{12}$) grouped together, the decoding circuit 54 checks the main conversion table 48 for a substitution rule to convert the first 3 codeword ($C_1$ to $C_9$). If no substitution rule exists, the decoding circuit 54 checks for a rule for the first 2 codeword ($C_1$ to $C_6$) and finally, if no rule exists, the decoding circuit 54 uses the main conversion table 48 to convert the first codeword $C_1C_2C_3$ to the first data word $D_1 D_2$. The number of codeword for which a match is found is the same number of data words that are shifted out of the outgoing data shift-register 56 and the same number of codeword that are shifted into the incoming codeword shift-register 52.

Figure 6:
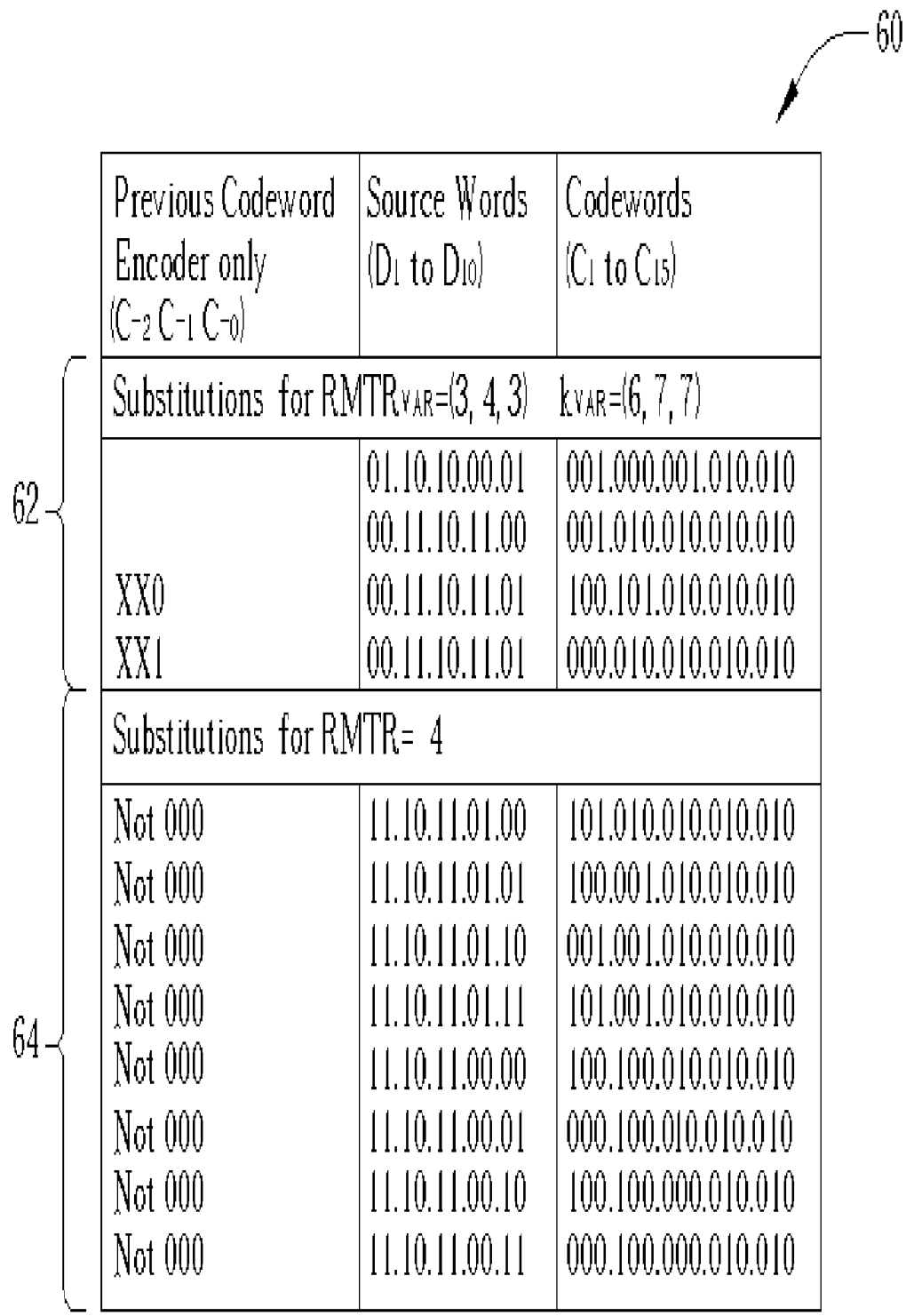
FIG. 6 is a first time-variable conversion table for use by the encoder of FIG. 3 and the decoder of FIG. 4 according to the first embodiment of the present invention.

FIG. 6 shows a first time-variable conversion table 60 according to the first embodiment of the present invention. The first embodiment is an RLL variable length code having the parameters: d=1, m=2, n=3, and r=5. The parity of the source words is preserved over the codeword and two characteristics of the RLL code are limited for each starting bit position in the codeword. Specifically, the repeated minimum transition runs RMTR is limited to 3 for the first bit position, 4 for the second bit position, and 3 for the third bit position, expressed as $RMTR_{VAR}$=(3, 4, 3). Secondly the maximum run of zeros k is limited to 6 for the first bit position, 7 for the second bit position, and 7 for the third position, expressed as $k_{VAR}$=(6, 7, 7). The first time-variable conversion table is divided into the following two sections:

62: Substitutions for $RMTR_{VAR}$=(3, 4, 3) $k_{VAR}$=(6, 7, 7) This section provides substitutions needed to ensure that the time variable $RMTR_{VAR}$ constraints and the time variable $k_{VAR}$ constraints are met.

64: Substitutions for RMTR=4 This section provides substitutions to limit the repeated minimum transition runs RMTR to 4.

When used in the encoder 40, shown in FIG. 4, the encoding circuit 44 searches the first time-variable conversion table for a match of the 5 source words ($D_1$ to $D_{10}$) and the previous codeword $C_{-2}C_{-1}C_0$. The searches are preformed starting from the top of the table and moving downward through the different sections. Concerning the previous codeword $C_{-2}C_{-1}C_0$, for some values of the source words ($D_1$ to $D_{10}$) no previous codeword $C_{-2}C_{-1}C_0$ is specified. This is to be considered as a don't care value for the previous codeword $C_{-2}C_{-1}C_0$ and any value is acceptable. The upper case "X" is a don't care value for a single bit, and "Not 000" is any value for the previous codeword $C_{-2}C_{-1}C_0$ except for "000".

When used in the decoder 50, shown in FIG. 5, the decoder circuit 54 first searches the first time-variable conversion table 60 for a match of the 5 codeword ($C_1$ to $C_{15}$). If no match is found, the decoder circuit 54 checks the main conversion table to search for a shorter match. If a match exists, then the decoder circuit 54 checks the next codeword $C_{16}C_{17}C_{18}$ for the value "010". If a match exists and $C_{16}C_{17}C_{18}$="010", the first time variable conversion table 60 is not used and the decoder circuit 34 uses the main conversion table to directly convert the first codeword $C_1C_2C_3$ to data bits $D_1D_2$. If a match exists and the next codeword $C_{16}C_{17}C_{18}$ is any other value, the decoder circuit 54 searches the first time-variable conversion table 60 for a match of the 5 codeword ($C_1$ to $C_{15}$).

FIG. 7 shows a second time-variable conversion table 70 according to the second embodiment of the present invention. The second embodiment is an RLL variable length code having the parameters: d=1, m=2, n=3, and r=5. The parity of the source words is preserved over the codeword and the time-variable parameters are: $RMTR_{VAR}$=(4, 5, 4) and $k_{VAR}$=(6, 7, 6). The second time-variable conversion table 70 has only one section:

72: Substitutions for $RMTR_{VAR}$=(4, 5, 4) $k_{VAR}$=(6, 7, 6)—This section provides substitutions needed to ensure that the time variable RMTR constraints and the time variable k constraints are met.

Depending on the chosen embodiment, either the first time-variable conversion table or the second time-variable conversion table can be used in the encoder 40 and decoder 50 according to present invention. The operation of the second time-variable conversion table is the same as that of the first time-variable conversion table described in FIG. 6.

FIG. 8 shows a main conversion table 80 according to the present invention. If the encoder circuit 44 or the decoder circuit 54 are unable to find a match in the time-variable conversion table 48, or in the case of the decoder, if the next codeword has a value of "010", the main conversion table 80 is used. The main conversion table 80 is divided into the following six different sections:

82: Substitutions for RMTR=5—This section provides substitutions to limit the repeated minimum transition runs RMTR to 5.

84: Substitutions for RMTR=6—This section provides substitutions to limit the repeated minimum transition runs RMTR to 6.

86: Substitutions for k=7—This section provides substitutions to limit the maximum runs k to 7.

88: Substitutions for k=8—This section provides substitutions to limit the maximum runs k to 8.

90: Substitutions for d=1—This section provides substitutions to limit the minimum runs d to 1.

92: Basic Substitutions—This section provides the basic substitutions from 2-bit source words to 3-bit codeword and vice versa while preserving the parity of the source words over the codeword.

When used in the encoder 40, shown in FIG. 4, the encoding circuit 44 searches the main conversion table for a match of the m source words ($D_1$ to $D_{2m}$) and the previous codeword $C_{-2}C_{-1}C_0$. The searches are preformed starting from the top of the table and moving downward through the different sections. Concerning the previous codeword $C_{-2}C_{-1}C_0$, for some values of the source words ($D_1$ to $D_{2m}$) no previous codeword $C_{-2}C_{-1}C_0$ is specified. This is to be considered as a don't care value for the previous codeword $C_{-2}C_{-1}C_0$ and any value is acceptable. The upper case "X" is a don't care value for a single bit, and "Not 000" is any value for the previous codeword $C_{-2}C_{-1}C_0$ except for "000".

Similar to the first and second time variable conversion tables, the main conversion table is searched starting from the top of the table and moving downward through the different sections. In the case of the decoder 50, shown in FIG. 5, the decoder circuit 54 first checks the next codeword for the value "010". For section 82 the next codeword is made up of the bits $C_{16}C_{17}C_{18}$, for sections 84 and 86 the next codeword is made up of the bits $C_{13}C_{14}C_{15}$. If the next codeword="010", the decoder uses the Basic Substitutions, section 92, to directly convert the first codeword $C_1C_2C_3$ to data bits $D_1D_2$. If the next codeword is any other value than "010", the decoder circuit 54 looks for a codeword match in the main conversion table 80. For sections 88, 90, and 92 decoding is independent of the next codeword, and the decoder circuit 54 looks for a codeword match in the main conversion table 80.

It should also be noted that the code tables are organized such that if the encoder and decoder both search only a subset of the sections, a valid RLL code is produced. For example, if both the encoder and decoder do not use the time-variable conversion table and instead only search downwards in the main conversion table starting at section 84: Substitutions for RMTR=6, the resulting RLL code will be RLL (1,7; 2,3; 5) with RMTR=6; if the search starts at section 86: Substitutions for k=7, the resulting RLL code will be RLL (1,7; 2,3; 5), etc.

In contrast to the prior art, the present invention encoder and decoder limits a characteristic of the codeword for each starting bit position in the codeword so that errors caused by 2T intervals being misread as 1T intervals can be corrected and mistakenly received SYNC patterns can be better detected.

The encoder generates codeword preserving the same parity as the source words. Similar to U.S. Pat. No. 4,477,222, this characteristic can be utilized for DC-suppressing purposes to generate DC-free signals.

Those skilled in the art will readily observe that numerous modifications and alterations of the device may be made while retaining the teachings of the invention. Accordingly, that above disclosure should be construed as limited only by the metes and bounds of the appended claims.

The invention claimed is:

1. A device for encoding a bit stream of data bits of a binary source signal into a stream of data bits of a binary channel signal, m-bit source words are converted to n-bit codeword, the device comprising:

converting means used to convert source words having a variable word length with a basic word length of m bits and a total word length of m*i bits into n*i-bit codewords, i being an integer of at least 1;

wherein the converting means limits a characteristic of the codeword specified for each starting bit position in the codeword.

2. The device of claim 1, wherein the converting means preserves the parity of the m-bit source words over the codewords.

3. The device of claim 1, wherein the converting means limits a maximum number of repeating bit patterns specified for each starting bit position in the codewords.

4. The device of claim 1, wherein the converting means limits a maximum number of the consecutive appearances of the minimum run of zeros d for each starting bit position in the codeword.

5. The device of claim 1, wherein the converting means limits a maximum run of zeros k for each starting bit position in the codewords.

6. A device for encoding a bit stream of databits of a binary source signal into a stream of databits of a binary channel signal, m-bit source words are converted to n-bit codewords, the device comprising:

converting means used to convert source words having a variable word length with a basic word length of m bits and a total word length of m*i bits into n*i-bit codewords, i being an integer of at least 1;

wherein the converting means limits a characteristic of the codewords specified for each starting bit position in the codeword; and the codewords are a variable length code (d, kVAR; m, n; r; RMTRVAR), wherein r is a maximum value of i and is at least 2, d is a minimum run of zeros, kVAR is a maximum run of zeros specified for each starting bit position in the codewords, and RMTRVAR is a maximum number of consecutive appearances of the minimum run of zeros d specified for each starting bit position in the codewords.

7. The device of claim 6, wherein the variable length code comprises:
d=1;
$RMTR_{VAR}$=(3, 4, 3);
$k_{VAR}$=(6, 7, 7);
m=2;
n=3; and
r=5.

8. The device of claim 6, wherein the variable length code comprises:
d=1;
$RMTR_{VAR}$=(4, 5, 4);
$k_{VAR}$r=(6, 7, 6);
m=2;
n=3; and
r=5.

9. The device of claim 1, wherein the converting means determines the codewords by referring to an immediately succeeding string of m-bit source words.

10. The device of claim 1, wherein the converting means determines the codeword by referring to an immediately preceding codeword.

11. A device for decoding a bit stream of data bits of a binary channel signal into a stream of data bits of a binary source signal, n bits channel codeword are converted to m-bit source words, the device comprising:
converting means used to convert codewords having a variable code length with a basic code length of n bits and a total code length of n*i bits into m*i-bit source words, i being an integer of at least 1;
wherein the bit stream of channel codewords have a characteristic specified for each starting bit position in the codeword.

12. The device of claim 11, wherein the converting means preserves the parity of the codeword over the m-bit source words.

13. The device of claim 11, wherein the codeword are limited with a maximum number of repeating bit patterns specified for each starting bit position.

14. The device of claim 11, wherein codeword are limited with a maximum number of the consecutive appearances of the minimum run of zeros d for each starting bit position in the codewords.

15. The device of claim 11, wherein codeword are limited with a maximum run of zeros k for each starting bit position in the codewords.

16. A device for decoding a bit stream of databits of a binary channel signal into a stream of databits of a binary source signal, n bits channel codewords are converted to m-bit source words, the device comprising:
converting means used to convert codewords having a variable code length with a basic code length of n bits and a total code length of n*i bits into m*i-bit source words, i being an integer of at least 1;
wherein the bit stream of channel codewords have a characteristic specified for each starting bit position in the codeword; and
the codewords are a variable length code (d, kVAR; m, n; r; RMTRVAR), wherein r is a maximum value of i and is at least 2, d is a minimum run of zeros, kVAR is a maximum run of zeros specified for each starting bit position in the codewords, and RMTRVAR is a maximum number of consecutive appearances of the minimum run of zeros d specified for each starting bit position in the codewords.

17. The device of claim 16, wherein the variable length code comprises:
d=1;
$RMTR_{VAR}$=(3, 4, 3);
$k_{VAR}$=(6, 7, 7);
m=2;
n=3; and
r=5.

18. The device of claim 16, wherein the variable length code comprises:
d=1;
RMTR=(4, 5, 4);
kvar=(6, 7, 6);
m=2;
n=3; and
r=5.

19. The device of claim 11, wherein the converting means determines the m-bit source words by referring to an immediately succeeding string of codewords.

20. A method for encoding a bit stream of data bits of a binary source signal into a stream of data bits of a binary channel signal, m-bit source words are converted to n-bit codeword, the method comprising:
converting source words having a variable word length with a basic word length of m bits and a total word length of m*i bits into n*i-bit codewords, i being an integer of at least 1; and
limiting a characteristic of the codeword specified for each starting bit position in the codeword.

21. The method of claim 20, further comprising preserving the parity of the m-bit source words over the codewords.

22. The method of claim 20, wherein limiting a characteristic of the codewords further comprises limiting a maximum number of repeating bit patterns specified for each starting bit position in the codewords.

23. The method of claim 20, wherein limiting a characteristic of the codewords further comprises limiting a maximum number of the consecutive appearances of the minimum run of zeros d for each starting bit position in the codewords.

24. The method of claim 20, wherein limiting a characteristic of the codewords further comprises limiting a maximum run of zeros k for each starting bit position in the codewords.

25. A method for encoding a bit stream of databits of a binary source signal into a stream of databits of a binary channel signal, m-bit source words are converted to n-bit codewords, the method comprising:
converting source words having a variable word length with a basic word length of m bits and a total word length of m*i bits into n*i-bit codewords, i being an integer of at least 1; and
limiting a characteristic of the codewords specified for each starting bit position in the codeword;
wherein the codewords are a variable length code (d, kVAR; m, n; r; RMTRVAR), wherein r is a maximum value of i and is at least 2, d is a minimum run of zeros, kVAR is a maximum run of zeros specified for each starting bit position in the codewords, and RMTRVAR is a maximum number of consecutive appearances of the minimum run of zeros d specified for each starting bit position in the codewords.

26. The method of claim 25, wherein the variable length code comprises:
d=1;
$RMTR_{VAR}$=(3, 4, 3);
$k_{VAR}$=(6, 7, 7);
m=2;
n=3; and
r=5.

27. The method of claim 25, wherein the variable length code comprises:
d=1;
$RMTR_{VAR}$=(4, 5, 4);
$k_{VAR}$r=(6, 7, 6);
m=2;
n=3; and
r=5.

28. The method of claim 20, further comprising determining the codewords by referring to an immediately succeeding string of m-bit source words.

29. The method of claim 20, further comprising determining the codeword by referring to an immediately preceding codeword.

30. A method for decoding a bit stream of databits of a binary channel signal into a stream of databits of a binary source signal, n bits channel codewords being converted to m-bit source words, and the method comprising:
converting codewords having a variable code length with a basic code length of n bits and a total code length of n*i bits into m*i-bit source words, i being an integer of at least 1; and
specifying a characteristic for each starting bit position in the channel codewords.

31. The method of claim 30, further comprising preserving the parity of the codeword over the m-bit source words.

32. The method of claim 30, wherein the codeword are limited with a maximum number of repeating bit patterns specified for each starting bit position in the codewords.

33. The method of claim 30, wherein the codeword are limited with a maximum number of consecutive appearances of a minimum run of zeros d specified for each starting bit position in the codewords.

34. The method of claim 30, wherein the codeword are limited with a maximum run of zeros k specified for each starting bit position in the codewords.

35. A method for decoding a bit stream of databits of a binary channel signal into a stream of databits of a binary source signal, n bits channel codewords being converted to m-bit source words, and the method comprising:
converting codewords having a variable code length with a basic code length of n bits and a total code length of n*i bits into m*i-bit source words, i being an integer of at least 1; and
specifying a characteristic for each starting bit position in the channel codewords;
the codewords are a variable length code (d, kVAR; m, n; r; RIVITRVAR), wherein r is a maximum value of i and is at least 2, d is a minimum run of zeros, kVAR is a maximum run of zeros specified for each starting bit position in the codewords, and RMTRVAR is a maximum number of consecutive appearances of the minimum run of zeros d specified for each starting bit position in the codewords.

36. The method of claim 35, wherein the variable length code comprises:
d=1;
$RMTR_{VAR}$=(3, 4, 3);
$k_{VAR}$=(6, 7, 7);
m=2;
n=3; and
r=5.

37. The method of claim 35, wherein the variable length code comprises:
d=1;
RMTR=(4, 5, 4);
kvar=(6, 7, 6);
m=2;
n=3; and
r=5.

38. The method of claim 30, further comprising determining the m-bit source words by referring to an immediately succeeding string of codewords.

39. The method of claim 1, wherein the starting bit positions of the codewords are defined in order of the bits of each codeword, each codeword having a first bit position corresponding to the first bit of the codeword and a last bit position corresponding to the last bit of the codeword.

40. The method of claim 11, wherein the starting bit positions of the codewords are defined in order of the bits of each codeword, each codeword having a first bit position corresponding to the first bit of the codeword and a last bit position corresponding to the last bit of the codeword.

41. The method of claim 20, wherein the starting bit positions of the codewords are defined in order of the bits of each codeword, each codeword having a first bit position corresponding to the first bit of the codeword and a last bit position corresponding to the last bit of the codeword.

42. The method of claim 30, wherein the starting bit positions of the codewords are defined in order of the bits of each codeword, each codeword having a first bit position corresponding to the first bit of the codeword and a last bit position corresponding to the last bit of the codeword.

* * * * *